United States Patent
Liu et al.

(10) Patent No.: US 12,223,866 B2
(45) Date of Patent: Feb. 11, 2025

(54) DISPLAY SUBSTRATE, TEST METHOD FOR THE SAME AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Guodong Liu, Beijing (CN); Peng Wu, Beijing (CN); Jideng Zhou, Beijing (CN); Yong Qian, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/273,066

(22) PCT Filed: Sep. 28, 2022

(86) PCT No.: PCT/CN2022/122068
§ 371 (c)(1),
(2) Date: Jul. 19, 2023

(87) PCT Pub. No.: WO2023/116106
PCT Pub. Date: Jun. 29, 2023

(65) Prior Publication Data
US 2024/0087492 A1    Mar. 14, 2024

(30) Foreign Application Priority Data
Dec. 24, 2021 (CN) .......................... 202111598699.2

(51) Int. Cl.
G09G 3/00 (2006.01)
G06F 3/041 (2006.01)
H01L 27/12 (2006.01)

(52) U.S. Cl.
CPC ............. *G09G 3/006* (2013.01); *G06F 3/041* (2013.01); *H01L 27/124* (2013.01);
(Continued)

(58) Field of Classification Search
CPC ................. G09G 3/006; G09G 3/3648; G09G 2300/0426; G09G 2300/0408;
(Continued)

(56) References Cited

U.S. PATENT DOCUMENTS

2017/0139292 A1  5/2017  Yu et al.
2018/0120992 A1  5/2018  Lee
(Continued)

FOREIGN PATENT DOCUMENTS

CN   105808014 A   7/2016
CN   106710541 A   5/2017
(Continued)

*Primary Examiner* — Jimmy H Nguyen
(74) *Attorney, Agent, or Firm* — WHDA, LLP (57) ABSTRACT

A display substrate, a test method for the display substrate and a display device are provided. The display substrate includes a base substrate, a touch detection circuit layer and a pixel driving circuit layer. The display substrate includes a display region and a non-display region surrounding the display region. The touch detection circuit layer includes a driving signal line and a dummy electrode line arranged side by side in the display region and insulated from each other, and both the driving signal line and the dummy electrode line extend from the display region to the non-display region. The non-display region is provided with a plurality (Continued)

of test pads including a first pad electrically connected to the driving signal line and a second pad electrically connected to the dummy electrode line.

20 Claims, 6 Drawing Sheets

(52) U.S. Cl.
CPC .............. *G09G 2300/0408* (2013.01); *G09G 2300/0413* (2013.01); *G09G 2310/0262* (2013.01); *G09G 2330/12* (2013.01); *G09G 2354/00* (2013.01)

(58) Field of Classification Search
CPC ... G09G 2300/0413; G09G 2310/0262; G09G 2330/12; G09G 2330/04; G09G 2354/00; H01L 27/124; G02F 1/133; G06F 3/0443; G06F 3/041; G06F 3/0412; G06F 3/04164; G06F 11/22
USPC .......................................... 345/206, 173, 87
See application file for complete search history.

(56) References Cited

U.S. PATENT DOCUMENTS

| | | |
|---|---|---|
| 2018/0203541 A1 | 7/2018 | Liu et al. |
| 2018/0239476 A1* | 8/2018 | Yoshida ................ H01L 27/124 |
| 2019/0272057 A1* | 9/2019 | Chen ........................ G06F 3/047 |
| 2021/0200359 A1 | 7/2021 | Lee et al. |
| 2021/0389863 A1 | 12/2021 | Lin et al. |

FOREIGN PATENT DOCUMENTS

| | | |
|---|---|---|
| CN | 107632436 A | 1/2018 |
| CN | 107861658 A | 3/2018 |
| CN | 108021268 A | 5/2018 |
| CN | 108426703 B | 3/2020 |
| CN | 113126342 A | 7/2021 |
| CN | 113805720 A | 12/2021 |
| JP | 2014-120038 A | 6/2014 |
| JP | 2015-148942 A | 8/2015 |

* cited by examiner

DISPLAY SUBSTRATE, TEST METHOD FOR THE SAME AND DISPLAY DEVICE

CROSS-REFERENCE TO RELATED APPLICATIONS

The present application is the U.S. national phase of International Application No. PCT/CN2022/122068 filed on Sep. 28, 2022. International Application No. PCT/CN2022/122068 claims priority to Chinese Patent Application No. 202111598699.2 filed in China on Dec. 24, 2021. Each of the above-listed applications is hereby incorporated in its entirety by reference.

TECHNICAL FIELD

The present disclosure relates to the field of display technologies, in particular to a display substrate, a test method for the display substrate and a display device.

BACKGROUND

Along with the development and improvement of display technology and integrated chip technology, TDDI (Touch and Display Driver Integration) display technology becomes the choice of many electronic products. During a manufacturing process, the performance of a TDDI display panel needs to be tested several times to determine whether there is abnormality in the display panel, so as to prevent the display panel having abnormality from flowing into a subsequent process, thereby to avoid the waste of labor and raw material resources.

SUMMARY

In some aspects, the present disclosure in some embodiments provides a display substrate, including a base substrate, a touch detection circuit layer and a pixel driving circuit layer. The display substrate includes a display region and a non-display region surrounding the display region. The touch detection circuit layer includes a driving signal line and a dummy electrode line arranged side by side in the display region and insulated from each other, and both the driving signal line and the dummy electrode line extend from the display region to the non-display region. The non-display region is provided with a plurality of test pads including a first pad electrically connected to the driving signal line and a second pad electrically connected to the dummy electrode line.

In some embodiments of the present disclosure, the display substrate further includes a common signal line arranged in the non-display region and surrounding the display region, the dummy electrode line is electrically connected to the common signal line in the non-display region, and the driving signal line and the common signal line are insulated from each other.

In some embodiments of the present disclosure, the display substrate further includes a driving integrated chip (IC) arranged in the non-display region, the driving signal line is electrically connected to the driving IC at a first connecting point, the first pad is electrically connected to the first connecting point via a first control switch, and the first control switch is configured to control the first connecting point to be electrically connected to, or electrically disconnected from, the first pad.

In some embodiments of the present disclosure, the pixel driving circuit layer includes a first transparent electrode, an insulating layer and a second transparent electrode laminated one on another in a direction away from the base substrate, the second pad is electrically connected to the dummy electrode line via a connecting trace, and the connecting trace is arranged at a same layer and made of a same material as the first transparent electrode or the second transparent electrode.

In some embodiments of the present disclosure the dummy electrode line is electrically connected to the driving IC at a second connecting point, the second pad is connected to the second connecting point via a second control switch, and the second control switch is configured to control the second connecting point to be electrically connected to, or electrically disconnected from, the second pad.

In some embodiments of the present disclosure, the first control switch includes a control end, a first end and a second end, the control end of the first control switch is electrically connected to a control signal line, the first end of the first control switch is electrically connected to the first pad, and the second end of the first control switch is electrically connected to the first connecting point. The second control switch includes a control end, a first end and a second end, the control end of the second control switch is electrically connected to the control signal line, the first end of the second control switch is electrically connected to the second pad, and the second end of the second control switch is electrically connected to the second connecting point. The control signal line is connected to a third pad of the plurality of test pads.

In some embodiments of the present disclosure, the third pad is electrically connected to a low-level signal terminal of the display substrate.

In some embodiments of the present disclosure, the first pad and the second pad are a same test pad. Alternatively, the first pad is electrically connected to the second pad, and an electrostatic ring is provided between adjacent pads of the plurality of test pads.

In some embodiments of the present disclosure, the first pad and the second pad are different test pads, and an electrostatic ring is provided between adjacent test pads in the plurality of test pads.

In some embodiments of the present disclosure, the plurality of test pads includes at least two rows of test pads arranged in sequence, and the test pads of the two adjacent rows of test pads are arranged in a staggered manner.

In some embodiments of the present disclosure, the electrostatic ring includes at least one or more anti-static units connected in series, and each anti-static unit includes a first switch transistor and a second switch transistor. The first switch transistor includes a control end, a first end and a second end, and the second switch transistor includes a control end, a first end and a second end. Both the control end and the first end of the first switch transistor are electrically connected to a first node, and the second end of the first switch transistor is electrically connected to a second node. Both the control end and the first end of the second switch transistor are electrically connected to the second node, and the second end of the second switch transistor is electrically connected to the first node.

In some aspects, the present disclosure provides in some embodiments a display device, including: the display substrate provided in some aspects of the present disclosure.

In some aspects, the present disclosure provides in some embodiments a test method for the display substrate provided in some aspects of the present disclosure, including: controlling a first test signal terminal to be electrically connected to the first pad, and providing a first test signal to the first pad through the first test signal terminal; and controlling a second test signal terminal to be electrically connected to the second pad, and providing a second test signal to the second pad through the second test signal terminal; where the first test signal and the second test signal are the same.

DETAILED DESCRIPTION

The technical solutions in the embodiments of the present disclosure will be described hereinafter clearly and completely with reference to the drawings of the embodiments of the present disclosure. Apparently, the following embodiments merely relate to a part of, rather than all of, the embodiments of the present disclosure. In the case of no conflict, the embodiments of the present disclosure and the features therein may be combined. Based on the embodiments of the present disclosure, a person of ordinary skill in the art may, without any creative effort, obtain other embodiments, which also fall within the scope of the present disclosure.

A manufacturing process of a display substrate includes a step of cutting a large-sized panel into small-sized display panels, and after the large-sized panel is cut to obtain the small-sized display panels, a cell test is required for the display effect of the display panel. An optional test manner is to control the display panel to display images of different grayscales and monochrome images of different colors, and then detect whether the display panel has a display defect through visual inspection or photographing the displayed images by using an image acquisition device.

Figure 1:
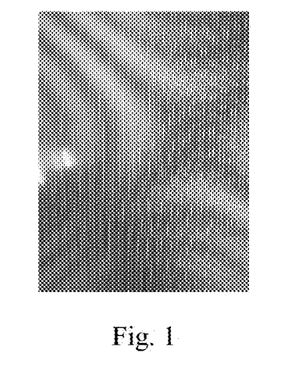
FIG. 1 is an image showing an abnormal display of a display substrate in the related art.

It has been found that, during the test process, when monochrome images with the same greyscale are displayed, an abnormal display may occur. As shown in FIG. 1, the abnormal display is specifically manifested in that many vertical stripes appear on the display interface, and the brightness of some sub-pixels of the display panel may be significantly higher than the brightness of other sub-pixels. It has been further found that the above-mentioned abnormal display is caused by the difference of signal lines in the touch-control module.

Figure 2:
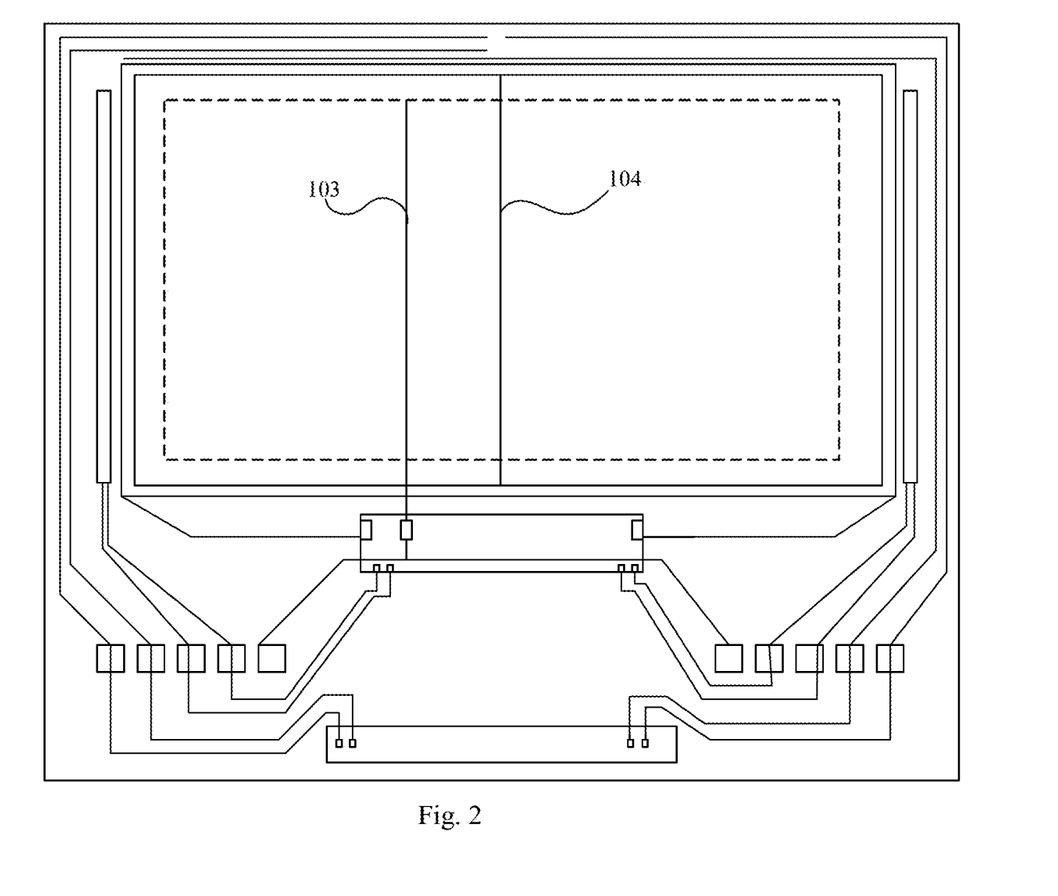
FIG. 2 is a schematic view showing the display substrate in the related art.

As shown in FIG. 2, specifically, the touch-control module of the display panel includes a driving signal line (Tx) 103, and in order to ensure that the driving signal line 103 is evenly distributed in a display region, a dummy electrode line 104 is further formed when forming the driving signal line 103, where the driving signal line 103 and the dummy electrode line 104 are formed through a single patterning process.

The connection modes of the dummy electrode line 104 and the driving signal line 103 are different. Specifically, it requires the driving signal line 103 to realize an electrical related signal transmission function. The driving signal line 103 and the dummy electrode line 104 may be formed in such a manner as to mainly improve the structural uniformity of the display panel. The dummy electrode line 104 is arranged at a position where the driving signal line 103 is not provided, so as to improve the structural uniformity of different regions of the display substrate. In addition, it does not require the dummy electrode line 104 to provide the touch-control function, but it requires the dunny electrode line 104 not to cause adverse effect on the display screen.

In the process of performing the above-mentioned test, a test signal is applied to the driving signal line 103, and since it does not require the dummy electrode line 104 to provide the electrical function, the test signal is not applied to the dummy electrode line 104. In this regard, a difference between the electric field at a position where the driving signal line 103 is located and the electric field generated at a position corresponding to the dummy electrode line 104 occurs, which thereby adversely affects the arrangement of the liquid crystal molecules 110 at different positions.

Since there is a difference in the arrangement of the liquid crystal molecules 110 between the position corresponding to the dummy electrode line 104 and the position corresponding to the driving signal line 103, when the dummy electrode line 104 and the driving signal line 103 are arranged along the longitudinal direction of the display panel, longitudinal stripes appear on the display panel.

Figure 3:
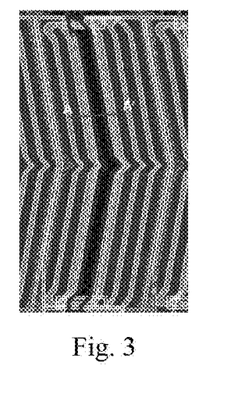
FIG. 3 is a schematic view showing a pixel electrode in the related art.

The electrodes of the sub-pixel generally include a first transparent electrode 107 and a second transparent electrode 109, as shown in FIG. 3, there may be a certain disconnected region within the first transparent electrode 107 of the sub-pixel of the display panel, and the second transparent electrode 109 is a partially hollowed-out slit-shaped electrode, and thus there may be an overlapping region between the disconnected region of the first transparent electrode 107 and the hollowed-out region of the second transparent electrode 109, and the overlapping region may further overlap the dummy electrode line 104 or the driving signal line 103.

Figure 4:
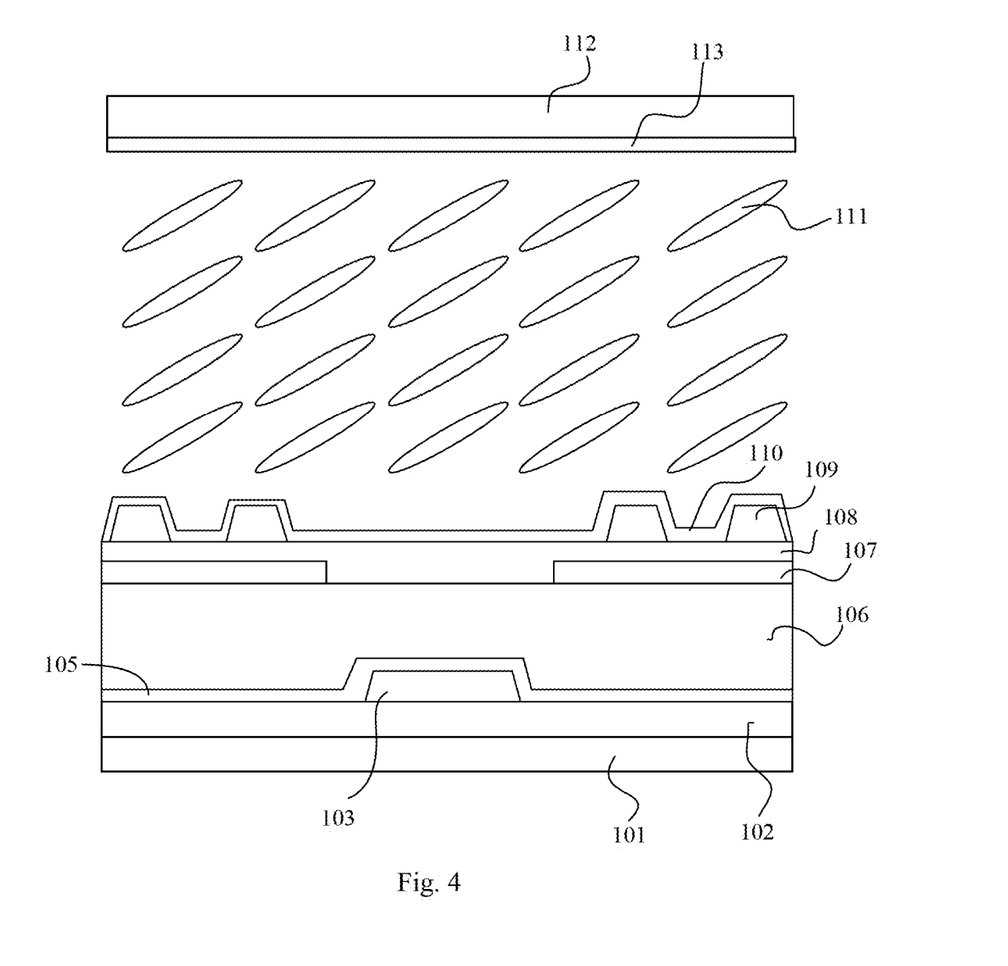
FIG. 4 is a sectional view of the pixel electrode in FIG. 3 along line A-A'.
Figure 5:
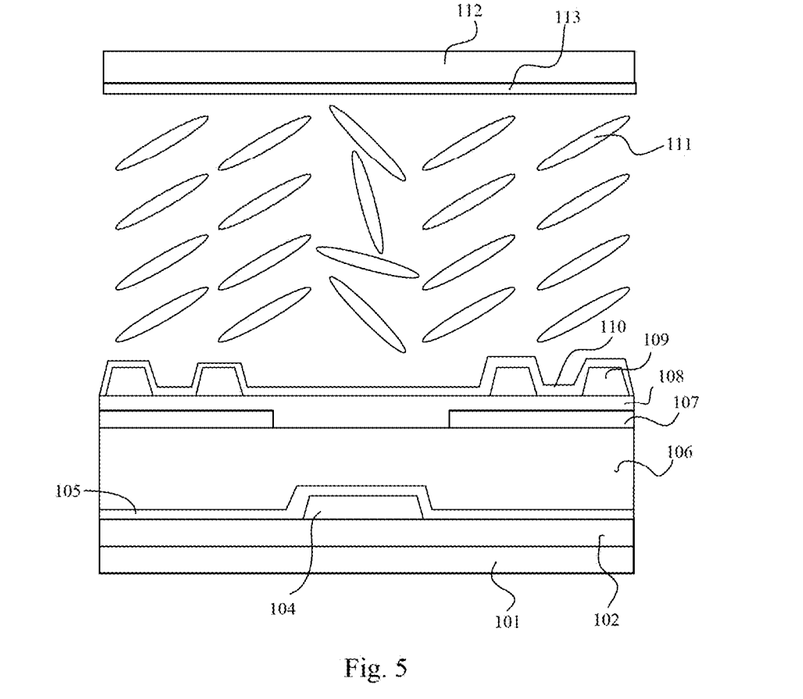
FIG. 5 is another sectional view of the pixel electrode in FIG. 3 along line A-A.

As shown in FIGS. 4 and 5, the display panel includes a display substrate, and the display substrate includes a base substrate 101, a gate insulating layer 102, a driving signal line 103, a dummy electrode line 104, a buffer layer 105, an organic layer 106, a first transparent electrode 107, an insulating layer 108 and a second transparent electrode 109. The display panel further includes a color filter substrate 112, a polyimide layer 113 located on the color filter substrate and a liquid crystal layer, and the liquid crystal layer includes a plurality of liquid crystal molecules 110.

At the position where the overlapping region overlaps with the dummy electrode line 104 or the driving signal line 103, the electric field at the position is provided by the dummy electrode line 104 or the driving signal line 103. As shown in FIG. 4, the liquid crystal molecules 110 at the position corresponding to the driving signal line 103 are arranged normally, while the liquid crystal molecules 110 in the region corresponding to the dummy electrode line 104 are arranged abnormally, thereby forming a region with abnormal brightness.

It should be appreciated that, since the signal connection modes of the display substrate are different during the test process and during actual use, the vertical stripes and topical abnormal brightness caused by the above-mentioned reasons may occur during the test process, but may not occur during the actual use. However, the vertical stripes and topical abnormal brightness may lead to the detection of other defects or abnormalities that adversely affect the display substrate. In this way, it causes the display panel that needs to be reworked or repaired to flow into subsequent processes, so as to cause waste of labor resources and raw materials.

The present disclosure provides in some embodiments a display substrate.

In some embodiments of the present disclosure, the display substrate is specifically an array substrate including a base substrate, a touch detection circuit layer and a pixel driving circuit layer.

Figure 6:
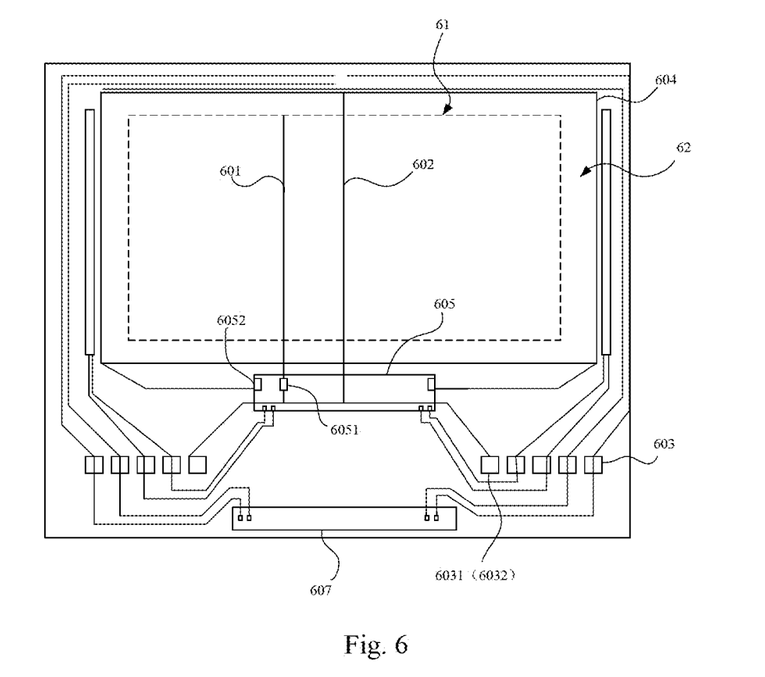
FIG. 6 is a schematic view showing a display substrate according to one embodiment of the present disclosure.

As shown in FIG. 6, the display substrate includes a display region 61 and a non-display region 62 surrounding the display region 61.

Referring to FIG. 6, the touch detection circuit includes a driving signal line (Tx) 601 and a dummy electrode line 602 arranged side by side in the display region 61 and insulated from each other, and both the driving signal line 601 and the dummy electrode line 602 extend from the display region 61 to the non-display region 62.

It should be appreciated that only one driving signal line 601 and one dummy electrode line 602 are shown in FIG. 6 for exemplary illustration, and a plurality of driving signal lines 601 and a plurality of dummy electrode lines 602, which are not shown, should be included in the display substrate.

The non-display region 62 is provided with a plurality of test pads 603 including a first pad 6031 electrically connected to the driving signal line 601 and a second pad 6032 electrically connected to the dummy electrode line 602.

The test pads 603 are used for acquiring test signals in the process of performing test on the display substrate. Specifically, when performing test on the display substrate, a test jig may be provided, and the test jig includes a plurality of binding posts connected to test signal terminals which provide different test signals respectively. When the test jig is connected to the display substrate, each binding post is in direct contact with the corresponding test pad 603, so as to achieve an electrical connection between each binding post and the corresponding test pad 603, and in this way, it is able to apply the test signal from the test signal terminal to the test pad 603 via the binding post.

The present disclosure further provides in some embodiments a test method for the display substrate in the embodiments of the present disclosure.

In some embodiments of the present disclosure, the test method includes the following steps:

controlling a first test signal terminal to be electrically connected to the first pad, and providing a first test signal to the first pad through the first test signal terminal; and controlling a second test signal terminal to be electrically connected to the second pad, and providing a second test signal to the second pad through the second test signal terminal;

where the first test signal and the second test signal are the same.

In the embodiment of the present disclosure, a first pad 6031 electrically connected to the driving signal line 601 and a second pad 6032 electrically connected to the dummy electrode line 602 are provided, so as to apply a first test signal to the driving signal line 601 via the first pad 6031 and apply a second test signal to the dummy electrode line 602 via the second pad 6032 during the test of the display substrate.

Thus, the electric field generated by the test signal exists in each of the region corresponding to the dummy electrode line 602 and the region corresponding to the driving signal line 601.

In some embodiments of the present disclosure, the first pad 6031 and the second pad 6032 are the same test pad 603, or the first pad 6031 and the second pad 6032 are electrically connected to each other.

It should be appreciated that, the first pad 6031 and the second pad 6032 are capable of acquiring the same test signal, it is because that the first pad 6031 and the second pad 6032 are the same test pad 603 or directly electrically connected to each other. In this regard, the first test signal and the second test signal are actually the same signal, so as to enable the electric field at the region corresponding to the driving signal line 601 to be substantially the same as the electric field at the region corresponding to the dummy electrode line 602, thereby to reduce the possibility of the occurrence of vertical stripes and reduce the possibility of topical abnormal brightness.

It should be appreciated that, in the case where the first test signal and the second test signal are the same, theoretically, the electric field generated at the region corresponding to the dummy electrode line 602 and the electric field generated at the region corresponding to the driving signal line 601 are also the same, it is able to reduce the influence of the electric field difference on the arrangement of the liquid crystal molecules in different regions, so as to reduce the possibility of vertical stripes occurring for the display substrate.

In addition, there is an overlapping region between the disconnected region of the first transparent electrode and the hollowed-out region of the second transparent electrode, and at the position where the overlapping region coincides with the dummy electrode line 602, since the first test signal is applied to the dummy electrode line 602, there is an electric field generated by the first test signal, thereby reducing the possibility of abnormal brightness at the position.

Based on the above-mentioned analysis, in the technical schemes of the present embodiment, through the first pad 6031 which is electrically connected to the driving signal line 601 and the second pad 6032 which is electrically connected to the dummy electrode line 602, it is able to apply the test signal to the driving signal line 601 and the dummy electrode line 602 during the test of the display substrate, so that the electric field is generated at each of the region corresponding to the driving signal line 601 and the region corresponding to the dummy electrode line 602, thereby reducing the possibility of vertical stripes and topical abnormal brightness occurring for the display panel during the test process.

Thus, in the embodiments of the present disclosure, since the possibility of vertical stripes and topical abnormal brightness occurring for the display panel during the test process is reduced, it is able to improve the accuracy of monitoring the state of the display substrate, and reduce the possibility of undetected defects on a portion of display substrates due to the abnormal display.

In some embodiments of the present disclosure, the display substrate further includes a common signal line 604 arranged in the non-display region 62 and surrounding the display region 61, the dummy electrode line 602 is electrically connected to the common signal line 604 in the non-display region 62, and the driving signal line 601 is insulated from the common signal line 604.

In the scheme of the embodiment of the present disclosure, the dummy electrode line 602 may be electrically connected to the first pad 6031 in different ways.

Figure 7:
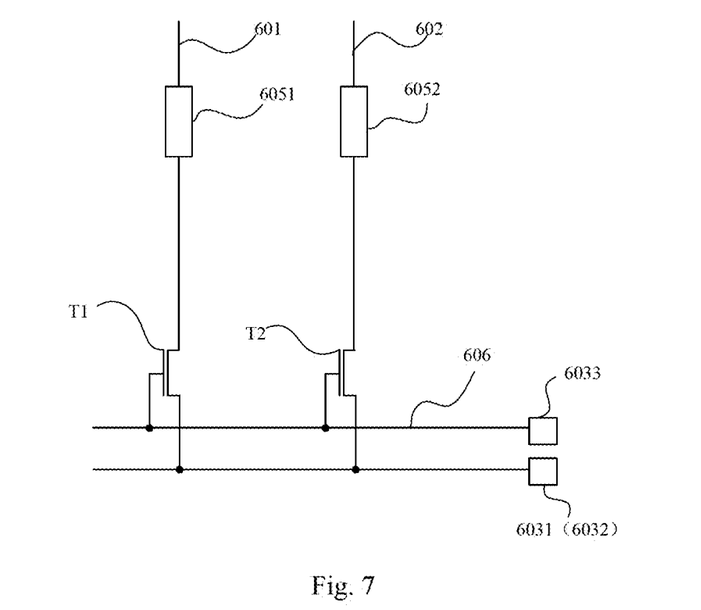
FIG. 7 is a schematic view showing a case where a driving signal line is electrically connected to a dummy electrode line according to one embodiment of the present disclosure.

As shown in FIGS. 6 and 7, in some embodiments of the present disclosure, the display substrate further includes a driving integrated chip (IC) 605, the driving IC 605 may be a TDDI (Touch and Display Driver Integration) chip, the driving IC 605 is arranged in the non-display region 62, the driving signal line 601 is electrically connected to the driving IC 605 at a first connecting point 6051, the first pad 6031 is electrically connected to the first connecting point 6051 via a first control switch T1, and the first control switch T1 is configured to control the first connecting point 6051 to be electrically connected to, or electrically disconnected from, the first pad 6031.

It should be appreciated that during the test of the display substrate, the first control switch T1 is turned on, so that the first connecting point 6051 is electrically connected to the first pad 6031, and it is able to apply the first test signal from the first pad 6031 to the driving signal line 601.

When the test of the display substrate is finished, the first control switch T1 is turned off, the first connecting point 6051 and the first pad 6031 may be considered as to be insulated from each other, so that it is able for the driving signal line 601 to acquire a corresponding driving signal from the driving IC 605.

Through the first control switch T1, it is able to have different electrical connection states between the driving signal line 601 and the first pad 6031 during the test process and after the test is finished, thereby to meet different control requirements.

As shown in FIGS. 6 and 7, in some embodiments of the present disclosure, the dummy electrode line 602 is electrically connected to the driving IC 605 at a second connecting point 6052, the second pad 6032 is connected to the second connecting point 6052 through a second control switch T2, and the second control switch T2 is configured to control the second connecting point 6052 to be electrically connected to, or electrically disconnected from, the second pad 6032.

In a similar manner to the control of the driving signal line 601, the second control switch T2 is turned on during the test, so that the second connecting point 6052 is electrically connected to the second pad 6032, and it is able to apply the second test signal from the second pad 6032 to the dummy electrode line 602.

When the second control switch T2 is turned off after the test of the display substrate is finished, the second connecting point 6052 and the second pad 6032 may be considered as to be insulated from each other.

Through the second control switch T2, it is able to have different electrical connection states between the dummy electrode line 602 and the second pad 6032 during the test process and after the test is finished, thereby to meet different control requirements.

As shown in FIG. 7, in some embodiments of the present disclosure, the first control switch T1 includes a control end, a first end, and a second end, the control end of the first control switch T1 is electrically connected to a control signal line 606, the first end of the first control switch T1 is electrically connected to the first pad 6031, and the second end of the first control switch T1 is electrically connected to the first connecting point 6051.

The second control switch T2 includes a control end, a first end and a second end, the control end of the second control switch T2 is electrically connected to the control signal line 606, the first end of the second control switch T2 is electrically connected to the second pad 6032, and the second end of the second control switch T2 is electrically connected to the second connecting point 6052.

The control signal line 606 is connected to a third pad 6033 of the plurality of test pads 603.

In the embodiment of the present disclosure, the control signal line 606 is connected to the third pad 6033 to which a third test signal is applied during the test, and both the first control switch T1 and the second control switch T2 are turned on under the control of the third test signal.

Furthermore, in the case where the first pad 6031 and the second pad 6032 are the same test pad 603, it is also considered that the dummy electrode line 602 is electrically connected to the driving signal line 601, so that it is able to apply the same test signal to the driving signal line 601 and the dummy electrode line 602.

Figure 8:
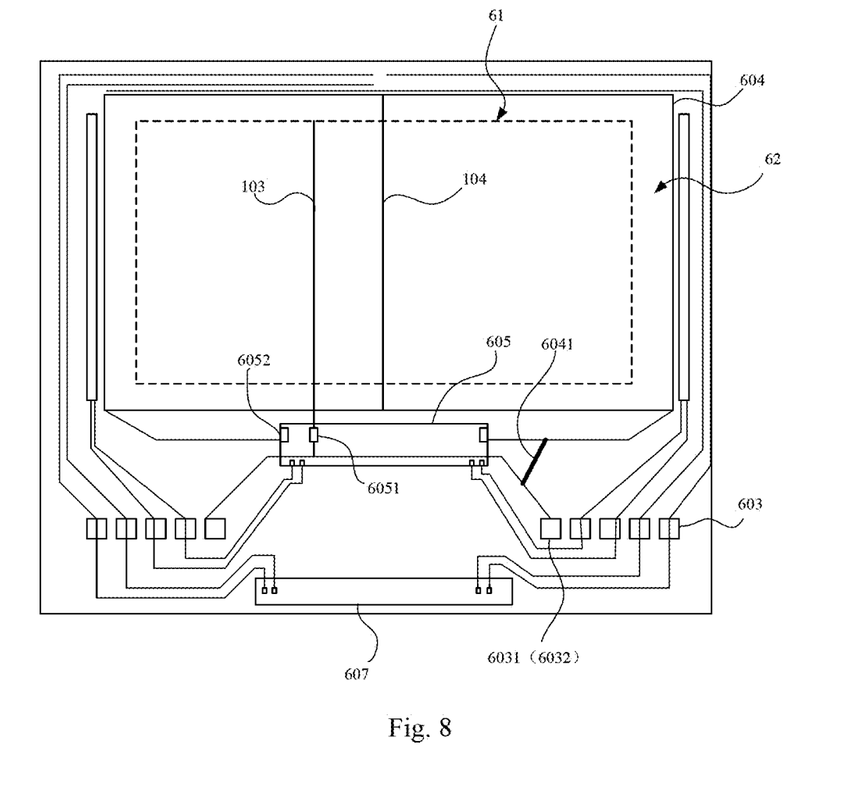
FIG. 8 is another schematic view showing the display substrate according to one embodiment of the present disclosure.

In some embodiments of the present disclosure, the pixel driving circuit layer includes a first transparent electrode, an insulating layer and a second transparent electrode laminated one on another in a direction away from the base substrate, as shown in FIG. 8, the second pad 6032 is electrically connected to the dummy electrode line 602 via a connecting trace 6041, and the connecting trace 6041 is arranged at the same layer and made of a same material as the first transparent electrode or the second transparent electrode.

In this embodiment of the present disclosure, the connecting trace 6041 may be formed through the first transparent electrode or the second transparent electrode in the pixel driving circuit according to needs.

It should be appreciated that the connecting trace 6041 may be formed through the first transparent electrode in some display substrates, while through the second transparent electrode in other display substrates.

Specifically, some display substrates include a laminated structure including an organic film layer, and thus forming the gate insulating layer of these display substrates does not include a step of patterning process (a mask process). The dummy electrode line 602 and the common signal line 604 may be formed through a single patterning process with the gate metal layer, and thus in the case where the first transparent electrode is used to form the connecting trace 6041, it is necessary to form a hole in the organic film layer and the gate insulating layer that are on the gate metal layer. However, it is unable for the gate insulating layer to be etched off when forming the hole in the organic film layer through etching, so it is unable to form the connecting trace 6041 through the first transparent electrode, and the connecting trace 6041 is formed only through the second transparent electrode.

When the connecting trace 6041 is formed through the second transparent electrode, a hole in the organic film layer that is on the gate metal layer is formed through etching at first, and then the insulating layer corresponding to the hole is etched off. When etching off the insulating layer, the gate insulating layer corresponding to the hole is etched off at the same time. In this way, when the second transparent electrode is formed, a pattern of the connecting trace 6041 is formed simultaneously, and the pattern of the connecting trace 6041 directly overlaps with the pattern of the common signal line 604 in the gate metal layer, so as to achieve an electrical connection.

In some embodiments of the present disclosure, the third pad 6033 is electrically connected to a low-level signal terminal (VGL) of the display substrate. In this way, when the test of the display substrate is finished and a subsequent normal use stage is entered, under the control of the low-level signal from the low-level signal terminal, both the first control switch T1 and the second control switch T2 are turned off, namely, the first connecting point 6051 is electrically disconnected from the first pad 6031, and the second connecting point 6052 is electrically disconnected from the second pad 6032, so as to enable the display substrate to operate normally, and prevent other signals from being transmitted to the first connecting point 6051 and the second connecting point 6052. Therefore, it is further able to prevent the first connecting point 6051 from being electrically connected to the second connecting point 6052, thereby to prevent the normal operation of the display substrate from being adversely affected.

It should be appreciated that in the case where the second pad 6031 is electrically connected to the dummy electrode line 602 via the connecting trace 6041, the first control switch T1 is turned off under the control of the low-level signal from the low-level signal terminal when the test of the display substrate is finished and the subsequent normal use stage is entered, while the dummy electrode line 602 is maintained to be electrically connected to the second pad 6032. However, since the first control switch T1 is tuned off to enable the driving signal line 601 to be electrically disconnected from the first pad 6031, even the first pad 6031 and the second pad 6032 may be the same test pad 603 or the first pad 6031 is electrically connected to the second pad 6032, the driving signal line 601 and the dummy electrode line 602 are insulated from each other after the first control switch T1 is turned off, so as to ensure that the display substrate operates normally.

Figure 9:
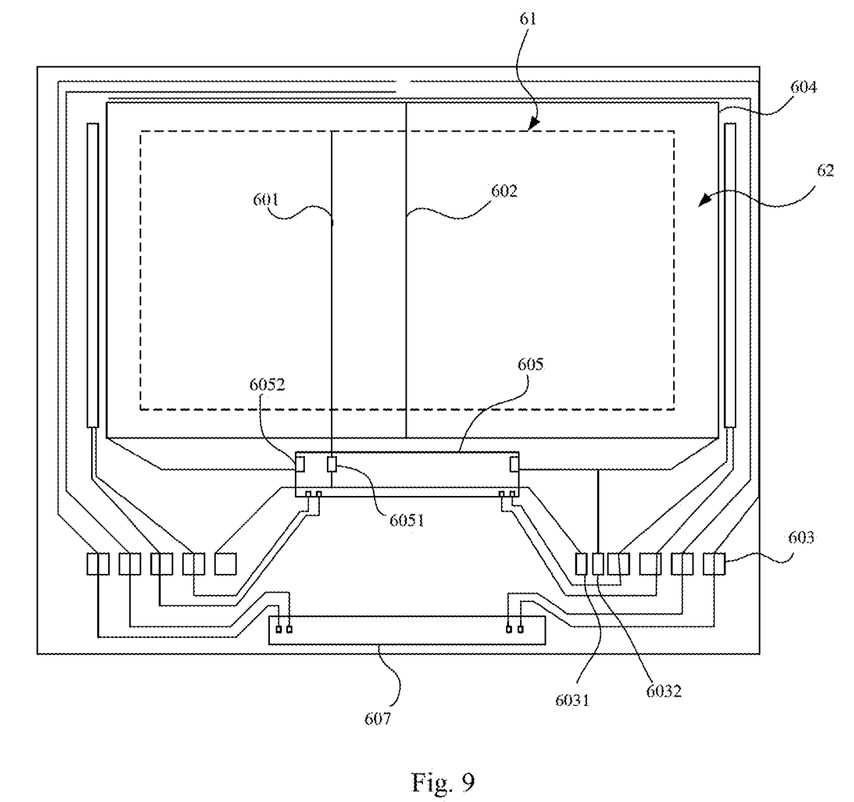
FIG. 9 is yet another schematic view showing the display substrate according to one embodiment of the present disclosure.

As shown in FIG. 9, in some embodiments of the present disclosure, the first pad 6031 and the second pad 6032 are different test pads 603. During the implementation, the first test signal is applied to the driving signal line 601 through the first pad 6031 and the second test signal is applied to the dummy electrode line 602 through the second pad 6032. The first test signal and the second test signal are independent of each other, and the first test signal and the second test signal may be the same or different, and it is also able to ensure that a signal is applied to the dummy electrode line 602, so as to reduce the possibility of the occurrence of vertical stripes and the possibility of topical abnormal brightness.

Figure 10:
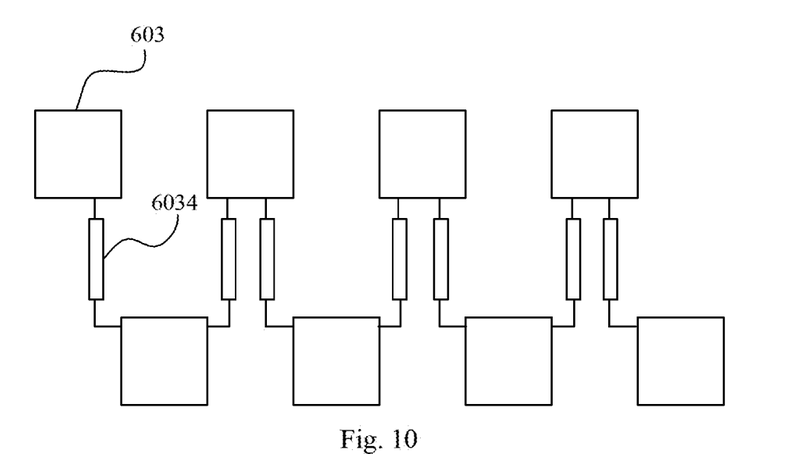
FIG. 10 is a schematic view showing the arrangement of test pads according to one embodiment of the present disclosure.

As shown in FIG. 10, in some embodiments of the present disclosure, the plurality of test pads 603 includes at least two rows of test pads 603 arranged in sequence, and the test pads 603 of the two adjacent rows of test pads 603 are arranged in a staggered manner.

It should be appreciated that, as compared with the related art, more test pads 603 are designed in the scheme of the present embodiment. In order to enable these test pads 603 to be arranged in a better manner, the test pads 603 are designed in a multi-row arrangement, while the test pads 603 in two adjacent rows are arranged in a staggered manner, any two test pads 603 in the same row are insulated from each other, and an electrostatic ring 6034 is arranged between two adjacent test pads 603 in different rows.

In some other embodiments of the present disclosure, the distribution of the test pads 603 may be adjusted according to a space of a frame and a structure of the display substrate, etc., which will not be particularly defined herein.

As shown in FIG. 10, in some embodiments of the present disclosure, the test pads 603 are insulated from each other, and the electrostatic ring 6034 may be further provided between adjacent test pads 603, so as to avoid electrostatic transmission and improve the reliability of the display substrate.

Figure 11:
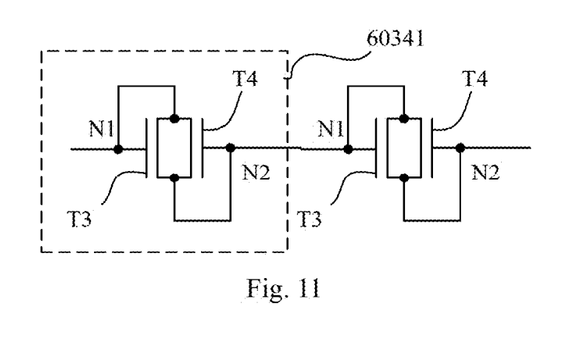
FIG. 11 is a schematic diagram view showing an electrostatic ring according to one embodiment of the present disclosure.

As shown in FIG. 11, in some embodiments of the present disclosure, the electrostatic ring 6034 includes at least one or more anti-static units 60341 connected in series, each anti-static unit 60341 includes a first switch transistor T3 and a second switch transistor T4, the first switch transistor T3 includes a control end, a first end and a second end, and the second switch transistor T4 includes a control end, a first end and a second end. Both the control end and the first end of the first switch transistor T3 are electrically connected to a first node N1, and the second end of the first switch transistor T3 is electrically connected to a second node N2. Both the control end and the first end of the second switch transistor T4 are electrically connected to the second node N2, and the second end of the second switch transistor T4 is electrically connected to the first node N1.

The first node N1 of the anti-static unit 60341 is connected to one test pad 603, and the second node N2 is connected to another test pad 603. In the case of a plurality of anti-static units 60341, the first node N1 of a first-level anti-static unit 60341 is connected to one test pad 603, the second node N2 of each level anti-static unit 60341 is connected to the first node N1 of a next level anti-static unit 60341, and the second node N2 of a last-level anti-static unit 60341 is connected to another test pad 603.

Through the electrostatic ring 6034, it is able to avoid electrostatic transmission among the test pads 603, thereby improving the reliability of the display substrate.

It should be appreciated that the display substrate may be subsequently bonded to a flexible circuit (FPC) 607 with reference to the related art, and the connection mode between each pin of the driving IC 605 and each pin of the FPC 607 may refer to the related art, which will not be particularly defined herein.

It should be appreciated that when the first pad 6031 and the second pad 6032 are the same, or the first pad 6031 is electrically connected to the second pad 6032, in the case where the common signal line 604 is electrically connected to the second pad 6032 via the connecting trace 6041, since the common signal line 604 is maintained to be electrically connected to the second pad 6032, so that there is a change in a potential at the pin electrically connected to the common signal line 604 on the FPC 607. Specifically, in the related art, the above-mentioned pin corresponds to a ground signal. In the embodiment of the present disclosure, the above-mentioned pin corresponds to a common signal. In addition, this change does not affect the normal operation of the display substrate.

In some other embodiments of the present disclosure, the potential at each pin is the same as in the related art and does not otherwise affect the normal operation of the display substrate.

In some aspects, the present disclosure provides in some embodiments a display device including any one of the above-mentioned display substrates. Since the scheme of the display device includes all the schemes of the above-mentioned display substrate, it is able to achieve at least all the above-mentioned technical effects, which will not be particularly defined herein.

The aforementioned are merely specific embodiments of the present disclosure, but a scope of the present disclosure is not limited thereto. Any modifications or replacements that would easily occurred to a person skilled in the art, without departing from the technical scope disclosed in the disclosure, should be encompassed in the scope of the present disclosure. Therefore, the scope of the present disclosure shall be subject to the scope defined by the appended claims.

What is claimed is:

1. A display substrate, comprising a base substrate, a touch detection circuit layer and a pixel driving circuit layer, wherein the display substrate comprises a display region and a non-display region surrounding the display region;

the touch detection circuit layer comprises a driving signal line and a dummy electrode line arranged side by side in the display region and insulated from each other, and both the driving signal line and the dummy electrode line extend from the display region to the non-display region;

the non-display region is provided with a plurality of test pads comprising a first pad electrically connected to the driving signal line and a second pad electrically connected to the dummy electrode line;

wherein the display substrate further comprises a common signal line arranged in the non-display region and surrounding the display region, the dummy electrode line is electrically connected to the common signal line in the non-display region, and the driving signal line and the common signal line are insulated from each other;

wherein the display substrate further comprises a driving integrated chip (IC) arranged in the non-display region, the driving signal line is electrically connected to the driving IC at a first connecting point, the first pad is electrically connected to the first connecting point via a first control switch, and the first control switch is configured to control the first connecting point to be electrically connected to, or electrically disconnected from, the first pad;

wherein the pixel driving circuit layer comprises a first transparent electrode, an insulating layer and a second transparent electrode laminated one on another in a direction away from the base substrate, the second pad is electrically connected to the dummy electrode line via a connecting trace, and the connecting trace is arranged at a same layer and made of a same material as the first transparent electrode or the second transparent electrode.

2. The display substrate according to claim 1, wherein the dummy electrode line is electrically connected to the driving IC at a second connecting point, the second pad is connected to the second connecting point via a second control switch, and the second control switch is configured to control the second connecting point to be electrically connected to, or electrically disconnected from, the second pad.

3. The display substrate according to claim 2, wherein the first control switch comprises a control end, a first end and a second end, the control end of the first control switch is electrically connected to a control signal line, the first end of the first control switch is electrically connected to the first pad, and the second end of the first control switch is electrically connected to the first connecting point;

the second control switch comprises a control end, a first end and a second end, the control end of the second control switch is electrically connected to the control signal line, the first end of the second control switch is electrically connected to the second pad, and the second end of the second control switch is electrically connected to the second connecting point;

the control signal line is connected to a third pad of the plurality of test pads.

4. The display substrate according to claim 3, wherein the third pad is electrically connected to a low-level signal terminal of the display substrate.

5. The display substrate according to claim 1, wherein the first pad and the second pad are a same test pad; or, the first pad is electrically connected to the second pad, and an electrostatic ring is provided between adjacent pads of the plurality of test pads.

6. The display substrate according to claim 1, wherein the first pad and the second pad are different test pads, and an electrostatic ring is provided between adjacent test pads in the plurality of test pads.

7. The display substrate according to claim 6, wherein the plurality of test pads comprises at least two rows of test pads arranged in sequence, and the test pads of the two adjacent rows of test pads are arranged in a staggered manner.

8. The display substrate according to claim 6, wherein the electrostatic ring comprises at least one or more anti-static units connected in series, and each anti-static unit comprises a first switch transistor and a second switch transistor, the first switch transistor comprises a control end, a first end and a second end, and the second switch transistor comprises a control end, a first end and a second end;

both the control end and the first end of the first switch transistor are electrically connected to a first node, and the second end of the first switch transistor is electrically connected to a second node;

both the control end and the first end of the second switch transistor are electrically connected to the second node, and the second end of the second switch transistor is electrically connected to the first node.

9. A display device, comprising the display substrate according to claim 1.

10. The display device according to claim 9, wherein the dummy electrode line is electrically connected to the driving IC at a second connecting point, the second pad is connected to the second connecting point via a second control switch, and the second control switch is configured to control the second connecting point to be electrically connected to, or electrically disconnected from, the second pad.

11. The display device according to claim 10, wherein the first control switch comprises a control end, a first end and a second end, the control end of the first control switch is electrically connected to a control signal line, the first end of the first control switch is electrically connected to the first pad, and the second end of the first control switch is electrically connected to the first connecting point;

the second control switch comprises a control end, a first end and a second end, the control end of the second control switch is electrically connected to the control signal line, the first end of the second control switch is electrically connected to the second pad, and the second end of the second control switch is electrically connected to the second connecting point;

the control signal line is connected to a third pad of the plurality of test pads.

12. The display device according to claim 9, wherein the first pad and the second pad are a same test pad; or, the first pad is electrically connected to the second pad, and an electrostatic ring is provided between adjacent pads of the plurality of test pads.

13. The display device according to claim 9, wherein the first pad and the second pad are different test pads, and an electrostatic ring is provided between adjacent test pads in the plurality of test pads.

14. The display device according to claim 13, wherein the plurality of test pads comprises at least two rows of test pads arranged in sequence, and the test pads of the two adjacent rows of test pads are arranged in a staggered manner.

15. The display device according to claim 13, wherein the electrostatic ring comprises at least one or more anti-static units connected in series, and each anti-static unit comprises a first switch transistor and a second switch transistor,
the first switch transistor comprises a control end, a first end and a second end, and the second switch transistor comprises a control end, a first end and a second end;
both the control end and the first end of the first switch transistor are electrically connected to a first node, and the second end of the first switch transistor is electrically connected to a second node;
both the control end and the first end of the second switch transistor are electrically connected to the second node, and the second end of the second switch transistor is electrically connected to the first node.

16. A test method for the display substrate according to claim 1, comprising:
controlling a first test signal terminal to be electrically connected to the first pad, and providing a first test signal to the first pad through the first test signal terminal; and
controlling a second test signal terminal to be electrically connected to the second pad, and providing a second test signal to the second pad through the second test signal terminal;
wherein the first test signal and the second test signal are the same.

17. The test method according to claim 16, wherein the dummy electrode line is electrically connected to the driving IC at a second connecting point, the second pad is connected to the second connecting point via a second control switch, and the second control switch is configured to control the second connecting point to be electrically connected to, or electrically disconnected from, the second pad.

18. The test method according to claim 17, wherein the first control switch comprises a control end, a first end and a second end, the control end of the first control switch is electrically connected to a control signal line, the first end of the first control switch is electrically connected to the first pad, and the second end of the first control switch is electrically connected to the first connecting point;
the second control switch comprises a control end, a first end and a second end, the control end of the second control switch is electrically connected to the control signal line, the first end of the second control switch is electrically connected to the second pad, and the second end of the second control switch is electrically connected to the second connecting point;
the control signal line is connected to a third pad of the plurality of test pads.

19. The test method according to claim 16, wherein the first pad and the second pad are a same test pad; or,
the first pad is electrically connected to the second pad, and an electrostatic ring is provided between adjacent pads of the plurality of test pads.

20. The test method according to claim 16, wherein the first pad and the second pad are different test pads, and an electrostatic ring is provided between adjacent test pads in the plurality of test pads.

* * * * *